United States Patent
Yamazaki et al.

(10) Patent No.: US 6,169,292 B1
(45) Date of Patent: Jan. 2, 2001

(54) THIN FILM TYPE MONOLITHIC SEMICONDUCTOR DEVICE

(75) Inventors: Shunpei Yamazaki, Tokyo; Satoshi Teramoto, Kanagawa, both of (JP)

(73) Assignee: Semiconductor Energy Laboratory Co., Ltd., Kanagawa (JP)

(*) Notice: Under 35 U.S.C. 154(b), the term of this patent shall be extended for 0 days.

(21) Appl. No.: 09/233,481

(22) Filed: Jan. 20, 1999

Related U.S. Application Data (62) Division of application No. 08/865,047, filed on May 29, 1997, which is a continuation of application No. 08/521,533, filed on Aug. 30, 1995, now abandoned.

(30) Foreign Application Priority Data

Aug. 31, 1994 (JP) .................................................. 6-230646

(51) Int. Cl.[7] .......................... A01L 29/04; A01L 31/036; A01L 29/74; A01L 31/111
(52) U.S. Cl. ........................ 257/72; 257/59; 257/155; 257/157; 257/162; 257/166
(58) Field of Search ........................ 257/59, 72; 438/157, 438/155, 162, 166

(56) References Cited

U.S. PATENT DOCUMENTS

| | | |
|---|---|---|
| 5,147,826 | 9/1992 | Liu et al. . |
| 5,275,851 | 1/1994 | Fonash et al. . |
| 5,313,075 | 5/1994 | Zhang et al. ............................ 257/57 |
| 5,315,132 | 5/1994 | Yamazaki ............................... 257/66 |
| 5,403,772 | 4/1995 | Zhang et al. . |
| 5,426,064 | 6/1995 | Zhang et al. . |
| 5,481,121 | 1/1996 | Zhang et al. . |
| 5,488,000 | 1/1996 | Zhang et al. . |
| 5,492,843 | 2/1996 | Adachi et al. . |
| 5,501,989 | 3/1996 | Takayama et al. . |
| 5,508,533 | 4/1996 | Takemura . |
| 5,529,937 | 6/1996 | Zhang et al. . |
| 5,534,716 | 7/1996 | Takemura . |
| 5,543,352 | 8/1996 | Ohtani et al. . |
| 5,563,426 | 10/1996 | Zhang et al. . |
| 5,569,610 | 10/1996 | Zhang et al. . |
| 5,569,936 | 10/1996 | Zhang et al. . |

(List continued on next page.)

FOREIGN PATENT DOCUMENTS

405335572 * 12/1993 (JP) ........................................ 257/59

OTHER PUBLICATIONS

Liu et al., "Polycrystalline Silicon Thin Film Transistors on Corning 7059 Glass Substrates Using Short Time, Low–Temperature Processing," Appl. Phys. Lett., vol. 62, No. 20, May 17, 1993, pp. 2554–2556.

Liu et al., "Selective Area Crystallization of Amorphous Silicon Films by Low–Temperature Rapid Thermal Annealing", Appl. Phys. Lett., vol. 55, No. 7, Aug. 14, 1989, pp. 660–662.

*Primary Examiner*—David Hardy
*Assistant Examiner*—Jesse A Fenty
(74) *Attorney, Agent, or Firm*—Nixon Peabody LLP; Jeffrey L. Costellia (57) ABSTRACT

A monolithic type active matrix semiconductor device comprises a substrate having an insulating surface, a first plurality of thin film transistors formed on the substrate, each having a first channel region comprising an amorphous silicon semiconductor film, and a second plurality of thin film transistors, each having a second channel region comprising a crystalline semiconductor film. The crystalline semiconductor film of the second plurality of thin film transistors has a substantially single crystalline structure (mono-domain structure) and is doped with a recombination center neutralizer at a concentration of $1 \times 10^{16}$ to $1 \times 10^{20}$ atoms/cm$^3$. The crystalline semiconductor film of the second plurality of thin film transistors contains a catalyst element which is capable of promoting crystallization of silicon.

55 Claims, 5 Drawing Sheets

U.S. PATENT DOCUMENTS

| | | | |
|---|---|---|---|
| 5,572,046 | * 11/1996 | Takemura | 257/66 |
| 5,580,792 | 12/1996 | Zhang et al. . | |
| 5,585,291 | 12/1996 | Ohtani et al. . | |
| 5,589,694 | 12/1996 | Takayama et al. . | |
| 5,595,923 | * 1/1997 | Zhang et al. | 437/41 |
| 5,595,944 | 1/1997 | Zhang et al. . | |
| 5,604,360 | 2/1997 | Zhang et al. . | |
| 5,605,846 | 2/1997 | Ohtani et al. . | |
| 5,606,179 | 2/1997 | Yamazaki et al. . | |
| 5,608,232 | 3/1997 | Yamazaki et al. . | |
| 5,612,250 | 3/1997 | Ohtani et al. . | |
| 5,614,426 | 3/1997 | Funada et al. . | |
| 5,614,733 | 3/1997 | Zhang et al. . | |
| 5,616,506 | 4/1997 | Takemura . | |
| 5,620,910 | 4/1997 | Teramoto . | |
| 5,621,224 | 4/1997 | Yamazaki et al. . | |
| 5,624,851 | 4/1997 | Takayama et al. . | |
| 5,637,515 | 6/1997 | Takemura . | |
| 5,639,698 | 6/1997 | Yamazaki et al. . | |
| 5,643,826 | 7/1997 | Ohtani et al. . | |
| 5,646,424 | 7/1997 | Zhang et al. . | |
| 5,648,662 | 7/1997 | Zhang et al. . | |
| 5,654,203 | 8/1997 | Ohtani et al. . | |
| 5,656,825 | 8/1997 | Kusumoto et al. . | |
| 5,663,077 | 9/1997 | Adachi et al. . | |
| 5,677,549 | 10/1997 | Takayama et al. . | |
| 5,696,386 | 12/1997 | Yamazaki . | |
| 5,696,388 | 12/1997 | Funada et al. . | |
| 5,700,333 | 12/1997 | Yamazaki et al. . | |
| 5,705,829 | 1/1998 | Miyanaga et al. . | |
| 5,712,191 | 1/1998 | Nakajima et al. . | |
| 5,744,822 | * 4/1998 | Takayama et al. | 257/66 |
| 5,756,364 | 5/1998 | Tanaka et al. . | |
| 5,811,328 | 9/1998 | Zhang et al. . | |
| 5,818,068 | * 10/1998 | Sasaki et al. | 257/59 |
| 5,883,016 | * 3/1999 | Chan et al. | 438/798 |
| 5,985,741 | * 11/1999 | Yamazaki et al. | 438/486 |

* cited by examiner

THIN FILM TYPE MONOLITHIC SEMICONDUCTOR DEVICE

This application is a Divisional Application of Ser. No. 08/865,047, filed May 29, 1997, which is itself a Continuation application of Ser. No. 08/521,533, filed Aug. 30, 1995, now abandoned.

BACKGROUND OF THE INVENTION

1. Field of the Invention

The present invention relates to a thin film type monolithic semiconductor device which has a plurality of thin film transistors (TFTs). The TFTs fabricated in the present invention are formed both on insulating substrates such as glass or the like and on semiconductor substrates such as single crystal silicon or the like. More particularly, the present invention relates to a semiconductor circuit which has a low speed operating matrix circuit such as a monolithic active matrix type circuit (which is used in a liquid crystal display or the like) and a high speed operating peripheral circuit to drive the matrix circuit.

2. Description of the Prior Art

In recent years, research has been made on semiconductor devices of insulated gate type, the devices having a thin film-like active layer (which is referred to as an active layer) on an insulating substrate. In particular, efforts are concentrated on studying thin film gate type transistors, or so-called thin film transistors (TFTs). The TFTs are formed on a transparent insulating film, and are used for the control of each pixel and in a driving circuit in a display which is formed of a liquid crystal or the like and which has a matrix structure.

Examples of thin film semiconductors which constitute TFTs include amorphous silicon semiconductors and crystalline semiconductors which are crystallized by heating or laser light irradiation of the amorphous silicon semiconductors. The TFTs using these amorphous silicon thin film and crystalline silicon thin film are referred to as amorphous silicon TFTs and crystalline TFTs.

Generally, the field mobility of semiconductors in an amorphous state is small, and therefore cannot be used in TFTs which are required to be operated at a high speed. Therefore, research and development has been carried out in recent years on crystalline TFTs for the fabrication of circuits which have higher performance.

Crystalline semiconductors have large field mobilities, and therefore can be operated at high speed. Since NMOS TFTs and PMOS TFTs are obtained with the crystalline silicon in the same manner, a CMOS circuit can be formed. For example, in an active matrix type liquid crystal display device, display devices with a monolithic structure in which both an active matrix type part and a peripheral circuit (drivers or the like) are constituted with a CMOS crystalline TFTs are known.

Figure 3:
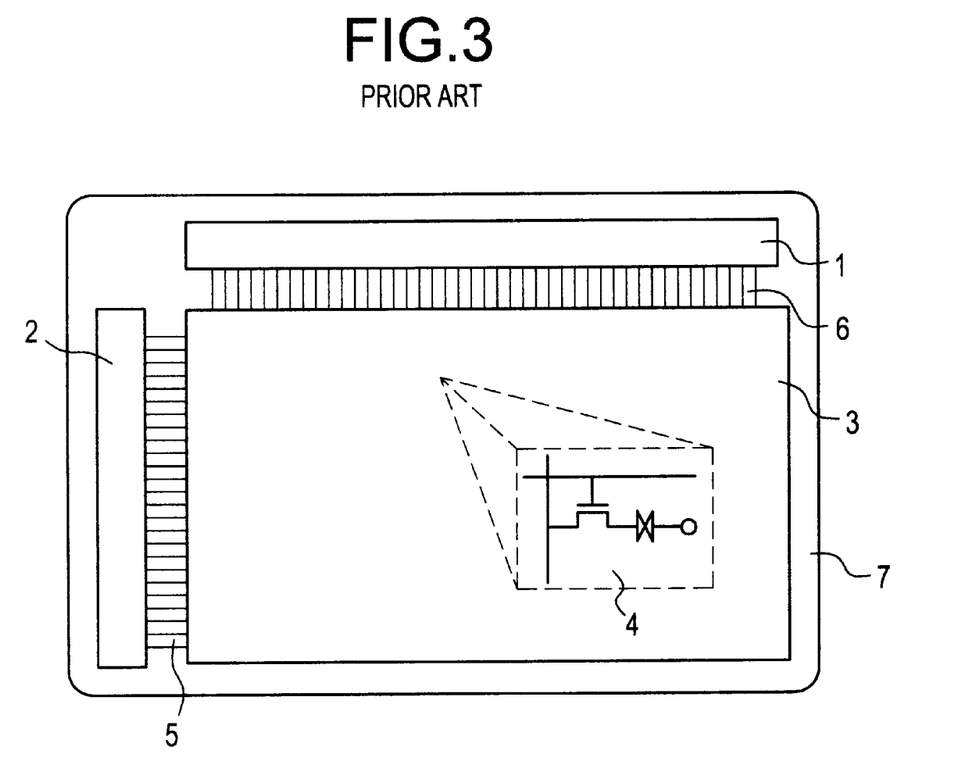
FIG. 3 is a schematic diagram showing an example of a monolithic type active matrix circuit in accordance with the present invention.

FIG. 3 shows a block diagram of a monolithic active matrix circuit used in a liquid crystal display. In a structure shown in FIG. 3, a column decoder 1 and a line decoder 2 are provided on a substrate 7 as a peripheral driver circuit. Further, in a matrix area 3 in which a plurality of pixels are arranged in a matrix configuration, a plurality of pixel circuits 4 which comprise transistors and capacitors are formed so that the matrix area and the peripheral circuit are connected with wires 5 and 6. The TFTs used in the peripheral circuit are required to be operated at a high speed while the TFTs used in the pixel circuit are required to have low current characteristics. These two characteristics are inconsistent to each other in terms of physics. However, the TFTs used in the peripheral circuit and the TFTs used in the pixel circuit are demanded to be formed on the same substrate at the same time.

However, the TFTs fabricated in the same process all exhibit the same characteristics. For example, means of crystallization (so-called laser anneal) can be used to obtain a crystalline silicon. However, in a silicon which has been crystallized by laser crystallization, the TFTs in the matrix area and TFTs in the peripheral driving circuit area exhibit the same characteristics. Therefore, the low leak current characteristics demanded of the pixel circuit and the high field mobility characteristics demanded of the peripheral circuit can coexist with great difficulty. The present invention is intended to solve such a difficult problem.

SUMMARY OF THE INVENTION

As a result of the investigations by the present inventors, it has been made clear that the crystallization of the silicon is promoted by doping an extremely small amount of a metal material to a silicon film in a substantially amorphous silicon so that the temperature of crystallization can be lowered, and the time required of the crystallization is shortened. As a catalyzing material, one or more kinds of elements selected from Fe, Co, Ni, Ru, Rh, Pd, Os, Ir, Pt, Cu, Ag and Au and further a compound of these elements (for example, a silicide) can be used.

Specifically, films, powders, clusters or the like containing these metal elements are allowed to adhere to the amorphous silicon film. Otherwise, these catalyzing elements are introduced into the amorphous silicon film by a method of ion doping process or the like followed by subjecting the film to the heat treatment at 550° C. or lower about 4 hours.

Quite naturally, there is a relation such that the crystallization time is shorter with higher annealing temperature. In addition, there is also a relation such that the crystallization temperature is lower, and the crystallization time is shorter with a higher concentration of the metal element. The investigation of the present inventors has revealed that the concentration of at least one element out of the aforementioned elements is required to be set to $1\times10^{16}$ cm$^{-3}$ or more to carry out the crystallization in a manner of thermal equilibrium. Further, it has been also made clear that when the concentration becomes $5\times10^{19}$ cm$^{-3}$ or more, the physical characteristics as a semiconductor material are lost. Thus, the metal element concentration to accelerate the crystallization of silicon is preferably within a range of $1\times10^{16}$ cm$^{-3}$ to $5\times10^{19}$ cm$^{-3}$. Further, it has been also made clear that use of nickel out of the aforementioned metal elements is the most favorable. Incidentally, the concentration of the impurity in this specification is defined as the minimum value measured with the SIMS (second ion mass spectrometer).

Further, it has been also made clear that a domain (which is referred to as a mono-domain area) with a large grain diameter is obtained by heating a sample at 450° C. or higher at the time of the laser light irradiation in a method for obtaining a crystalline silicon thin film by carrying out the crystallization by irradiating an amorphous silicon film with laser light. This mono-domain area has a crystal structure inside of which can be regarded as a substantially single crystal.

No crystal grain boundary exists inside of the mono-domain area. In addition, the mono-domain has point defects that should be neutralized unlike the single crystal silicon wafer. The mono-domain contains $1\times10^{16}$ cm$^{-3}$ to $1\times10^{20}$ cm$^{-3}$ of a recombination center neutralizer such as hydrogen or a halogen element which neutralizes the point defect.

In the case where a metal element such as the aforementioned nickel or the like is introduced into a starting film for forming the aforementioned mono-domain area, a mono-domain area with smaller defect concentration can be obtained. In the case where a thin film transistor is fabricated by using the mono-domain area which is formed by the introduction of this metal element, it is possible to obtain a TFT which has a high field mobility and allows the passage of a larger ON current. In other words, it is possible to obtain a TFT which has characteristics required for arranging the TFTs in a peripheral circuit area of a liquid crystal display with an active matrix structure.

Further, it has been made clear that an amorphous silicon TFT can be sufficient as the TFT which is arranged in each pixel in a matrix area because of the problem of the response speed of the liquid crystal (even when the thin film transistor is operated at any high speed, the liquid crystal cannot follow the speed). Since the OFF current is small instead of the fact that the TFT cannot be operated at a high speed, the amorphous silicon TFT has the most appropriated characteristics for switching the pixel.

The present invention is characterized by the fabrication of a thin TFT having a selectively different characteristics on the same substrate by using the operation of a metal element which promotes the crystallization of the aforementioned silicon. In other words, an amorphous silicon film is formed, a material selectively having a catalyst element on part thereof is closely contacted or mixed, and then a required area is irradiated with laser light or strong light having the same intensity or laser light or strong light having the same intensity is selectively scanned in a state in which the sample is heated at 450 to 750° C., or preferably at 450 to 600° C. so that an area where a thin film transistor constituting a peripheral circuit area constitutes a mono-domain area thereby forming a TFT with a high field mobility, a high speed operation and a structure that allows a large ON current to flow by using the aforementioned area. Then, the matrix area is retained in an amorphous state, and an amorphous silicon TFT for switching pixels is formed by using the area.

In this manner, a mono-domain TFT which can be operated at a high speed and an amorphous silicon TFT which has a low OFF current characteristics can be selectively fabricated on the same substrate.

Incidentally, it is very important to heat the sample at 450 to 750° C. or at 450 to 600° C. in consideration of the heat resistance of the glass substrate at the time of irradiating the sample with the laser light or strong light for forming a mono-domain area.

Further, it is effective to heat treat the sample before or after the irradiation of the sample with laser light or strong light for forming a mono-domain area. In the case where the sample is heat treated before the irradiation of laser light, a nucleus of a crystal growth at the time of laser light irradiation can be formed. Further, when the sample is heat treated after the irradiation of laser light, defects in the film can be reduced. Further, heat treating the sample before and after the laser light irradiation provides the following two effects. That is, the crystal nucleus can be formed and the defects in the film can be reduced.

According to a main aspect of the present invention, there is provided a monolithic active matrix circuit which is formed on a substrate, characterized in that a metal element promoting the crystallization of silicon is doped at a concentration of $1\times10^{18}$ to $5\times10^{19}$ cm$^{-3}$ into at least a part of an active area of a thin film transistor which constitutes a peripheral circuit, the active area of the thin film transistor in a matrix area can be constituted of an amorphous silicon semiconductor film, and a channel formation area in at least a part of the TFT which constitutes the aforementioned peripheral driving circuit.

Figure 1A:
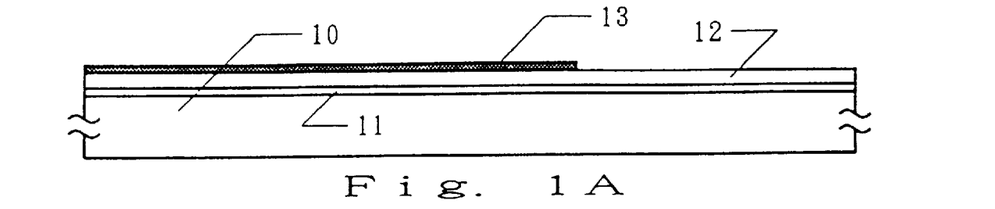
FIGS. 1A–1E are cross sectional views showing a manufacturing process in accordance with the first embodiment of the present invention.
Figure 1B:
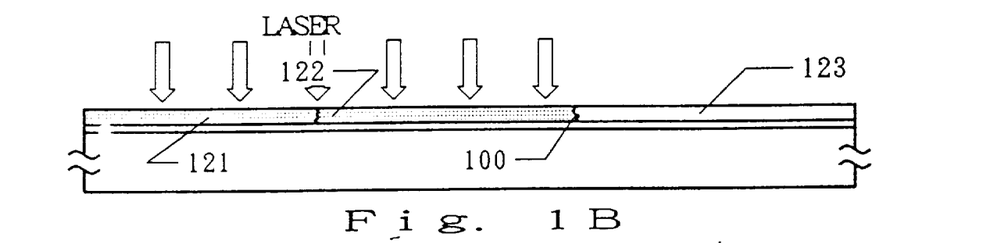
Figure 1C:
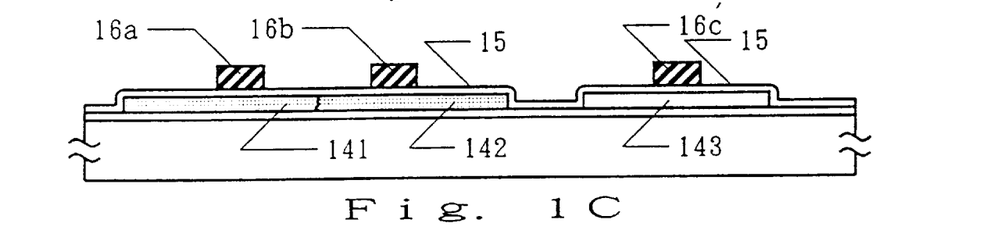

In the aforementioned structure, a structure shown in FIG. 3 can be formed as "a monolithic active matrix circuit which is formed on the substrate". Further, as "at least part of the TFT which constitutes the peripheral driving circuit", a TFT which constitutes a peripheral driving circuits 1 and 2 shown in FIG. 3 can be formed. Further, examples of the active area of the TFT include a source area and a drain area of a TFT and an area which includes a channel formation area as shown in FIG. 1(c) 142 and 143. In this active area, an offset gate area and a light dope area may be included.

Further, examples of the "matrix area" include an area denoted by reference numeral 3 in FIG. 3. This matrix area is an area where a plurality of pixels (which amount to several million in number) are arranged. Further, examples of the "structure constituted of a thin film silicon semiconductor film in which a channel formation area has a mono-domain structure", include an example shown in FIGS. 1B and 1C.

That is, active regions 141 and 142 of the TFTs are formed in mono-domain areas 121 and 122. Further, reference numeral 123 denotes an amorphous silicon semiconductor film. An active layer 143 of the amorphous silicon TFT which is arranged in a matrix area is formed by using this area.

Also, not all the TFTs arranged in the peripheral driving circuits are needed to have a structure that allows a high field mobility and a high speed operation and which allows a large ON current to flow. When an inverter circuit as shown in FIG. 5A or 5B is used, the N-channel TFTs 601 and 603 function as a negative load resistance, which does not need a high field mobility, a high speed operation or a large ON current to flow.

Figure 5A:
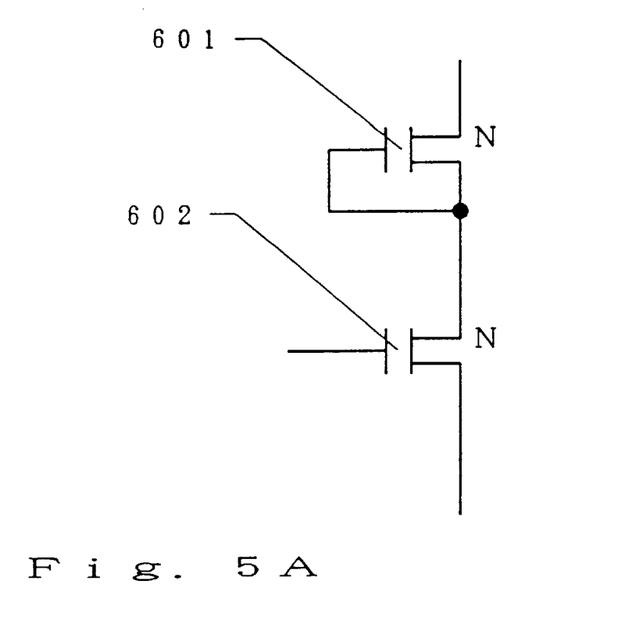
FIGS. 5A and 5B are diagrams showing examples of an inverter circuit which constitutes a peripheral driving circuit.

FIG. 5A shows a basic structure of an inverter in which a depression type transistor is used as an N-type TFT 601 which functions as a load and an enhancement type transistor is used as an N-type TFT 602. In addition, FIG. 5B shows a basic structure of an inverter in the case where an enhancement type transistor is used as an N-type TFT 603 which functions as a load, and an enhancement type transistor is also used as an N-type thin film transistor 602.

In such a case, it is not always necessary to constitute the active areas of the thin film transistors 601 and 603 by using a metal element which promotes the crystallization. Further, the active areas of the TFTs 601 and 603 need not be constituted in a mono-domain structure.

Figure 5B:
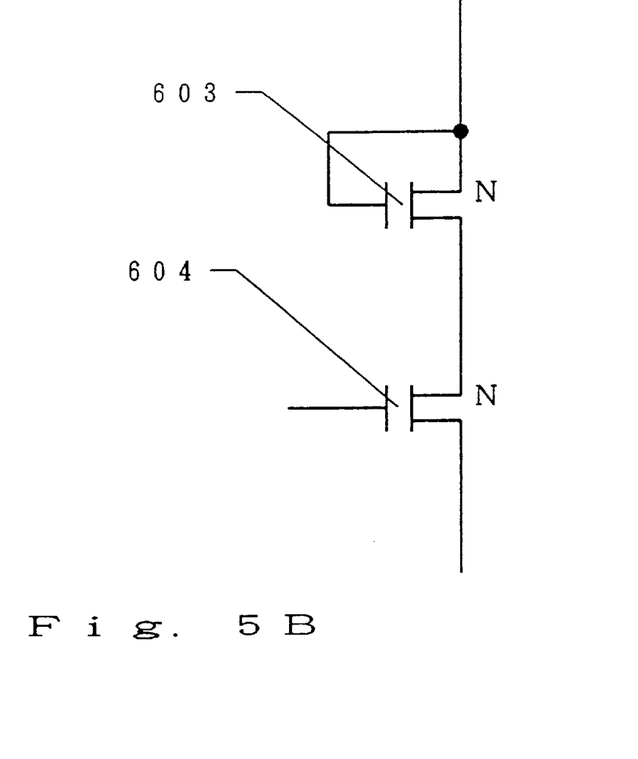

Therefore, in such a case, TFTs denoted by reference numerals 602 and 604 in FIGS. 5A and 5B correspond to TFTs which constitute the peripheral driving circuit in the present invention.

According to another feature of the invention, there is provided a monolithic active matrix circuit which is formed on a substrate, characterized in that a metal element is doped for promoting the crystallization of silicon at a concentration of $1\times10^{16}$ to $5\times10^{19}$ cm$^{-3}$ into at least a part of thin film transistors constituting a peripheral driving circuit in the present invention. The active area of the thin film transistor in the matrix area is constituted of an amorphous semiconductor film, and the active area of at least a part of the thin film transistors which constitute said peripheral circuit has a thin film silicon semiconductor film having a mono-domain structure.

In accordance with the present invention, a catalyst metal element is introduced into a selected portion of an amorphous silicon film selectively and a laser light irradiation is performed with the silicon film heated. Thus, a crystalline semiconductor film having a mono-domain structure is formed in the selected portion. This crystalline semiconductor film is suitable for forming an active region of a TFT for a driving circuit of an active matrix device because of its high mobility, high speed and large current characteristics. On the other hand, the other region of the silicon film, namely the region where the catalyst metal element is not introduced, remains amorphous. Accordingly, TFTs having active regions made of an amorphous silicon can be formed in a pixel region of the active matrix device on the same substrate, which do not have a high field mobility but a low off current property.

In this manner, a circuit having both low off current TFTs and high speed TFTs can be simultaneously formed on the same substrate.

DESCRIPTION OF THE PREFERRED EMBODIMENTS

Embodiment 1

In Embodiment 1, an amorphous silicon film is selectively crystallized by selectively introducing a metal element which promotes the crystallization of silicon into the amorphous silicon film to constitute an active layer of the TFT which constitutes a peripheral circuit by using a mono-domain area.

FIGS. 1A–1E show a sectional view showing a fabrication process of Embodiment 1. Two thin film transistors on the left side of FIG. 1E correspond to two TFTs arranged on the peripheral driving circuit (corresponding to reference numerals 1 and 2 of FIG. 3) while one TFT on the right side of FIG. 1E corresponds to a TFT arranged in a matrix area (corresponding to reference numeral 3 in FIG. 3).

Initially, a base film 11 formed of 2000 Å thick silicon oxide is formed on the substrate 10 (Corning 7059) by the sputtering process. Further, an intrinsic (I-type) amorphous silicon film 12 is deposited to a thickness of 500 to 1500 Å, or for example, 500 Å by the plasma CVD or the reduced pressure thermal CVD. Further, an extremely thin silicon film 13 (with a thickness of 5 to 200 Å, for example 50 Å) which contains nickel at a concentration of $1 \times 10^{18}$ cm$^{-3}$ is selectively formed as shown in FIG. 1A. To selectively form this silicon film 13, a sputtering process and a lift-off process may be used. In this manner, a state in which nickel element is introduced into the amorphous silicon film is realized.

In this embodiment, an example is shown in which nickel element is introduced by using a silicon film containing nickel. However, nickel may be selectively introduced into the amorphous silicon film by selectively coating a solution containing nickel (nickel acetate solution or the like may be used) on the surface.

Subsequently, an area of the amorphous silicon film 12 where an extremely thin silicon film 13 containing nickel is formed is irradiated with laser light for the selective crystallization of the amorphous silicon film 12 as shown in FIG. 1 B. Here, as the laser light, a KrF excimer laser (with a wave length of 248 nm and a pulse width of 20 nsec) is used. The film is heated at 550° C. during the laser irradiation. The heating is performed for example, by heating a substrate holder by a heater embedded therein, or irradiating an infrared light to the film.

As the laser light, for example, a XeF excimer laser (with a wave length of 353 nm), a XeCl excimer laser (with a wave length of 308 nm), and an ArF excimer laser (with a wave length of 193 nm) may be used. The laser energy concentration may be set to 200 to 500 mJ/cm$^2$, or, for example, 350 mJ/cm$^2$ and one place may be irradiated with two to ten shots of laser light, for example, two shots of laser light.

The area of the amorphous silicon film where nickel is introduced (an area on which the silicon film 13 containing nickel is formed) can be crystallized by the irradiation of the aforementioned laser light. At the time of this crystallization, a plurality of mono-domain areas are formed. A plurality of mono-domain areas which are formed by this crystallization are denoted by reference numerals 121 and 122 in FIG. 1B. The area denoted by reference numeral 123 is not crystallized and remain in an amorphous state since the nickel is not introduced therein and the area is not irradiated with laser light. Also, reference numeral 100 denotes a crystal grain boundary.

Figure 4A:
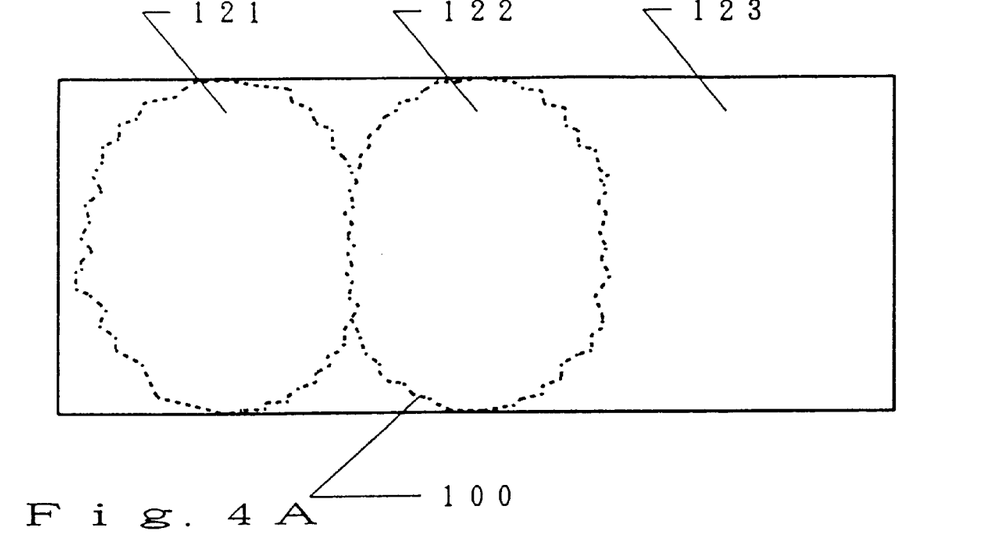
FIGS. 4A and 4B are schematic diagrams showing crystal grains and the device formation regions in accordance with the present invention.

FIG. 4A shows a state when the state shown in FIG. 1 B is seen from the top surface. FIG. 4A shows mono-domain areas 121 and 122. The silicon film obtained in this manner is patterned with photolithography process so that an island-like areas 141 and 142 (peripheral driving circuit) and 143 (matrix area) are formed. In this manner, the areas denoted by reference numerals 141 and 142 are constituted as mono-domain areas while the area denoted by reference numeral 143 is constituted as an active layer which is formed in the amorphous area as shown in FIG. 4B.

In the case of the TFT constituting a peripheral driving circuit, at least the channel region is formed in the mono-domain area. Further, it is more desirable that an active layer which constitutes each of the thin film transistors is constituted in one mono-domain area.

Figure 4B:
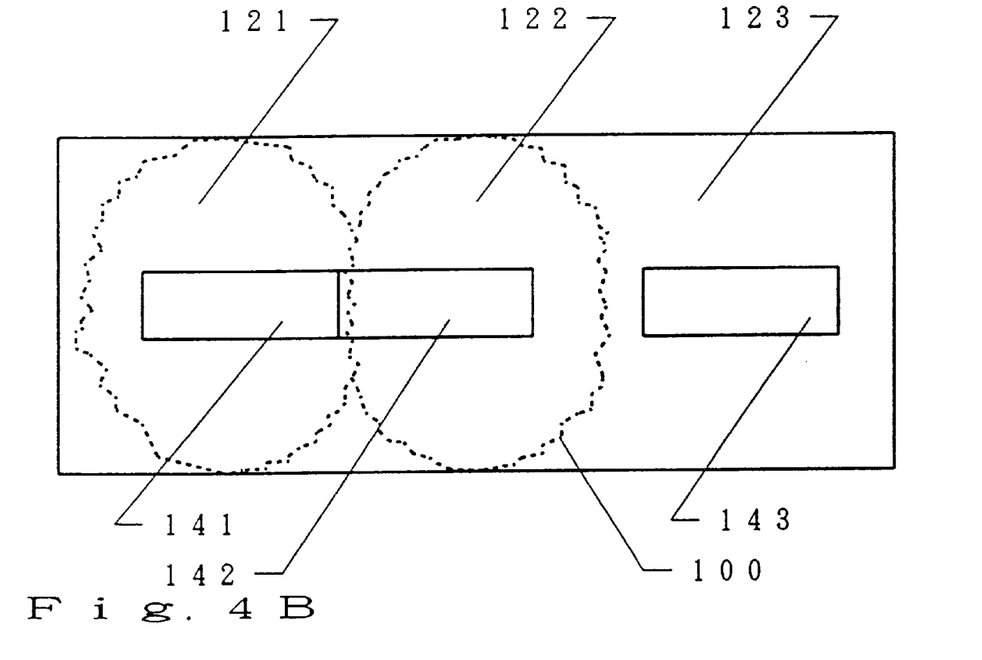

FIG. 4B shows a position relations between the mono-domain area and the island-like silicon area 141 which constitutes an active layer. As shown in FIG. 4B, the island-like silicon areas 141 and 142 which constitute the active layer are constituted inside of the outline of each of the mono-domain areas 121 and 122. In addition, the island-like silicon area 143 arranged in the matrix area is constituted in the amorphous area 123.

Next, a silicon oxide film 15 having a thickness of 1000 Å is deposited as a gate insulating film by a sputtering process. In the sputtering process, silicon oxide is used as a target. The substrate temperature at the time of sputtering is set to 200 to 400° C., or, for example 350° C. The sputtering atmosphere is set to argon/oxygen=0 to 0.5, for example, 0.1 or less. Then, a silicon film with a thickness of 3000 to 8000 Å, for example 6000 Å (containing 0.1 to 2% of phosphor) is deposited by the reduced pressure CVD. Also, this silicon oxide film 15 and the silicon film may be desirably formed in a continuous manner. Then, the silicon film is patterned to form gate electrodes 16a, 16b and 16c (FIG. 1C).

Then, impurities (phosphor and boron) are doped into the silicon area by the plasma doping process by using the gate electrode as a mask. Here as a doping gas, phosphine ($PH_3$) and diborane ($B_2H_6$) are used. In the former case, an accelerating voltage is set to 60 to 90 kV, or, for example 80 kV while the accelerating voltage is set to 40 to 80 kV, for example, 65 kV. The dose amount is set to $1 \times 10^{15}$ to $8 \times 10^{15}$ $cm^{-2}$, for example, the dose amount of phosphor is set to $2 \times 10^{15}$ $cm^{-2}$ and the dose amount of boron is set to $5 \times 10^{15}$ $cm^{-2}$. As a result, an N-type impurity area 17a and a P-type impurity areas 17b and 17c are formed.

Figure 1D:
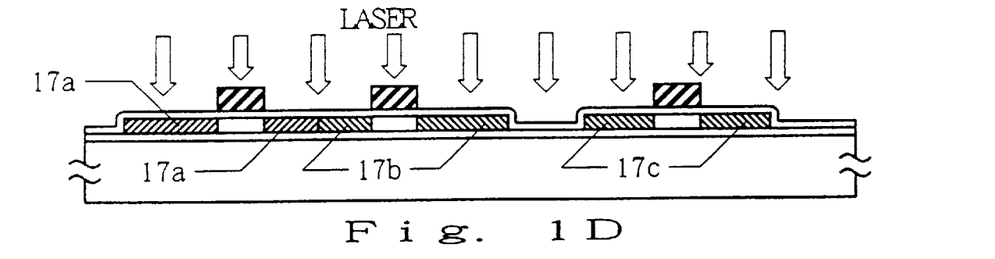

Then, the impurity is activated by the irradiation of the laser light. As the laser light, the KrF excimer laser (with a wave length of 248 nm and a pulse width of about 20 nsec) may be used. In addition, as the laser light, for example, a XeF excimer laser (with a wave length of 353 nm), a XeCl excimer laser (with a wave length of 308 nm) or an ArF excimer (with a wave length of 193 nm) may be used. The energy concentration of the laser may be set to 200 to 400 $mJ/cm^2$, for example, 250 $mJ/cm^2$ so that one place is irradiated with two to ten shots, for example, two shots of laser light. Further, at the time of the laser irradiation, the substrate is heated to 100 to 450° C., for example, 250° C. In this manner, the impurity areas 17a to 17c are activated (FIG. 1 D).

In addition, it is effective to heat the sample from the range of 450 to 750° C., preferably, from 500 to 600° C. at the time of the activation of the impurity area 17a to 17c by the irradiation of laser light. Thus, the impurity area 17a to 17c can be effectively activated.

Figure 1E:
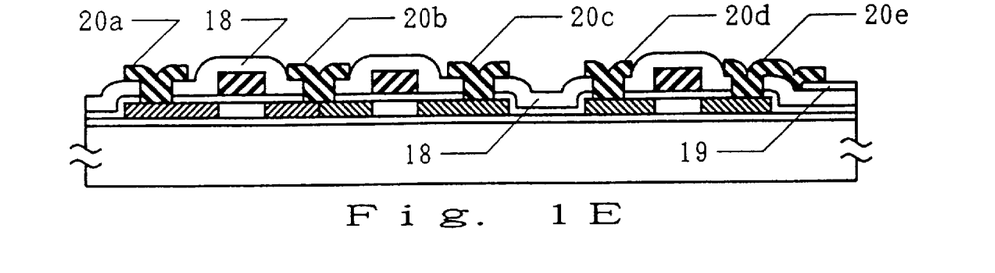

Subsequently, a silicon oxide film 18 having a thickness of 6000 Å is formed as an interlayer insulating film by a plasma CVD. Further, an indium tin oxide film (ITO) with a thickness of 500 to 1000 Å, for example, 800 Å is formed by the sputtering process. Then, the indium tin oxide (ITO) film is patterned to form a pixel electrode 19. Then, a contact hole is formed on the interlayer insulating film to form electrodes and wirings 20a, 20b and 20c of a peripheral driving circuit TFT, and electrodes and wirings 20d and 20e of a matrix pixel circuit TFT with a multiple layer formed of a metal material such as a titanium nitride and aluminum. Lastly, the electrodes and wirings are subjected to 30 minutes annealing at 350° C. in the hydrogen atmosphere with one atmospheric pressure thereby completing a semiconductor circuit (FIG. 1E).

When the concentration of nickel which is contained in an active area of a thin film transistor (TFT) obtained in the embodiment is analyzed with the secondary ion mass spectrometer (SIMS), $1 \times 10^{17}$ to $5 \times 10^{17}$ $cm^{-3}$ of nickel is detected from TFTs in the peripheral circuit area while the concentration in the TFT of the pixel area is less than the measurement limit ($1 \times 10^{16}$ $cm^{-3}$).

The left two TFTs in the peripheral circuit area have few defects and a high mobility and allow a large ON current through it.

Also, the TFT shown in the left side of the drawing is used as a pixel transistor in the pixel region. The active region of this TFT comprises an amorphous semiconductor film, which is not capable of driving at a high speed but is advantageous because of its low off current property. That is, it is possible to retain the electric charges applied to each pixel electrode because of the low off current.

Embodiment 2

FIGS. 2A–2E show a sectional view showing a step of fabricating a semiconductor circuit according to embodiment 2. In the beginning, on a substrate (Corning 7059) 21, a silicon oxide film 22 having a thickness of 2000 Å is formed by a sputtering process. Subsequently, an amorphous silicon film 23 having a thickness of 200 to 1500 Å, or, for example, 500 Å is deposited by a plasma CVD or a reduced pressure CVD. Then, the amorphous silicon film 23 is masked with a photoresist 24 to selectively dope nickel ions by the ion doping process. Here, an area 25 is fabricated where only $1 \times 10^{16}$ $cm^{-3}$ to $1 \times 10^{18}$ $cm^{-3}$, for example, $5 \times 10^{16}$ $cm^{-3}$ of nickel is contained. The depth of this area 25 is set to 200 to 500 Å and an optimal acceleration energy is selected in accordance with the depth. When the ion doping process is used like Embodiment 2, an effect can be obtained in that the concentration of nickel can be easily controlled as compared with Embodiment 1 (FIG. 2 A).

Then, the substrate is subjected to two hour heat treatment at 450 to 550° C., or, for example, 550° C. As a result of this heat treatment, the crystallization preliminarily proceeds in an area in which nickel is doped. In other words, crystal nuclei are formed which facilitate the growth at the time when the mono-domain area is grown. Further, at this step, the crystallization does not proceed in an area where the nickel element is not introduced.

Figure 2A:
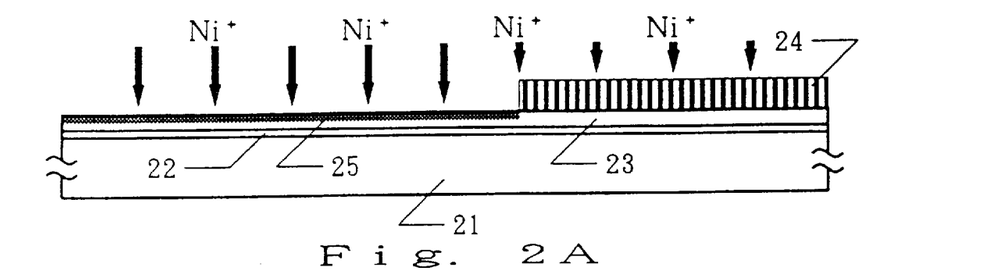
FIGS. 2A–2E are cross sectional views showing a manufacturing process in accordance with the second embodiment of the present invention.
Figure 2B:
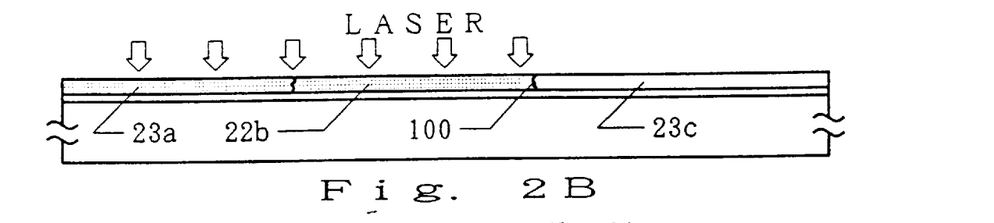

Then, the area 25 of the amorphous silicon film 23 is irradiated with laser light for the crystallization of the area while the sample is heated to 550° C. As the laser light, the KrF excimer laser (with a wave length of 248 nm and a pulse width of 20 nsec) is used. The energy concentration of the laser light is set to 200 to 500 $mJ/cm^2$, or, for example, 350 $mJ/cm^2$. One place is irradiated with two to ten shots, for example, two shots of laser light (FIG. 2B).

As a result, the silicon film is crystallized to form a plurality of mono-domain areas. The mono-domain areas located adjacent to each other are separated by a crystal grain boundary 100. What is shown in FIG. 2B are mono-domain areas 23a and 23b, and the amorphous silicon film 23c.

Further, this silicon film is patterned to form island-like areas 26a and 26b (peripheral driving circuit areas) and 26c (matrix pixel circuit areas). Here, these areas 26a and 26b are formed of mono-domain areas while the island-like area 26c is formed of an amorphous silicon area.

Further, a silicon oxide film 27 having thickness of 1000 Å is formed as a gate insulating film of TFTs by the plasma CVD by using tetra ethoxy silane ($Si(OC_2H_5)_4$, TEOS) and oxygen as raw materials.

Furthermore, an aluminum film (containing 2% of silicon or scandium) having a thickness of 6000 to 8000 Å, for example 6000 Å is deposited by a sputtering process. Instead of aluminum, tantalum, titanium or molybdenum may be used. The step of forming this silicon oxide film 27 and the step of forming the aluminum film are desirably performed in a continuous manner.

Figure 2C:
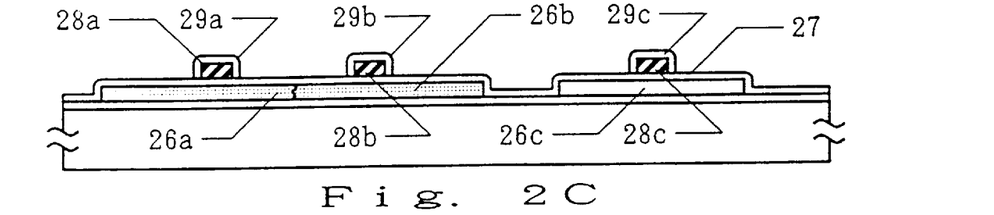

Then the aluminum film is patterned to form gate electrodes 28a, 28b and 28c of the TFT. Further, the surface of this aluminum wiring is subjected to anodic oxidation to form an oxide layer 29a, 29b and 29c on the surface. An anodic oxidation is performed in an ethylene glycol solution which contains 2 to 5% of tartaric acid. The thickness of the oxide layer thus obtained is 2000 Å (FIG. 2 C).

Subsequently, an impurity (phosphorus) is doped into the silicon area by the plasma doping process. Here, a phosphine ($PH_3$) is used as a doping gas. The acceleration voltage is set to 60 to 90 kV, for example 80 kV. The dose amount is set to $1\times10^{15}$ to $8\times10^{15}$ cm$^{-2}$, for example, $2\times10^{15}$ cm$^{-2}$. In this manner, an N-type impurity area 30a is formed. In addition, the TFT on the left side (N-channel type TFT) is masked with a photoresist to dope an impurity (boron) into the TFT on the right side of the peripheral circuit (P-channel type TFT) and the silicon area of the TFT in the matrix area by the plasma doping process. Here, diborane ($B_2H_6$) is used as a doping gas. The acceleration voltage is set to 50 to 80 kV, for example 65 kV. The dose amount is set to $1\times10^{16}$ to $8\times10^{16}$ cm$^{-2}$, for example to $5\times10^{16}$ cm$^{-2}$, which is larger than the dose amount of phosphorus that has been doped before diborane. In this manner, a P-type impurity areas 30b and 30c are formed in this manner.

Figure 2D:
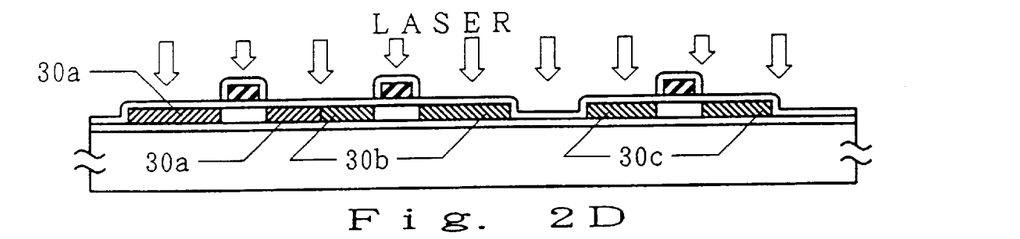

Further, the impurity is activated by the laser anneal process. As the laser, KrF excimer laser (with a wave length of 248 nm and a pulse width of 20 nsec) is used. The energy concentration of laser is set to 200 to 400 mJ/cm$^2$, for example 250 mJ/cm$^2$ so that one place is irradiated with two to ten shots, for example, two shots of laser light (FIG. 2D).

Figure 2E:
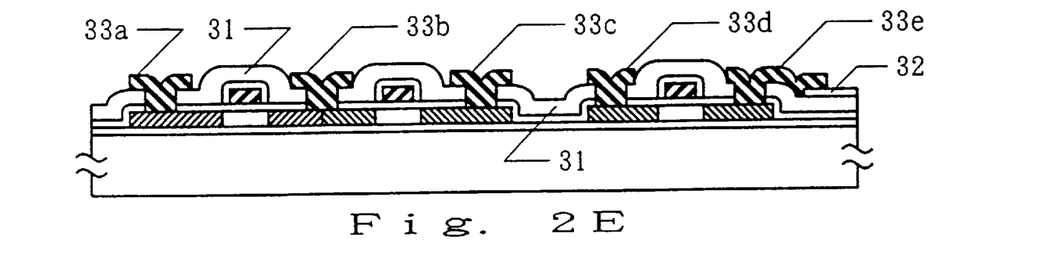

Subsequently, a silicon oxide film 31 having a thickness of 2000 Å is formed as an interlayer insulating film by a plasma CVD using TEOS as a material. Further, by a sputtering process, an indium tin oxide film (ITO) with a thickness of 500 to 1000 Å, for example, 800 Å is deposited. Then, the indium tin oxide film is deposited to form a pixel electrode 32 by etching. Further, a contact hole is formed in the interlayer insulating film 31. Then, a source electrode, a drain electrode and wirings 33a, 33b and 33c of the peripheral driving circuit TFT and the electrode and wiring 33d and 33e of the pixel circuit TFTs are formed with a multiple layer formed of a metal material such as a titanium nitride and aluminum. In the aforementioned step, a semiconductor circuit is completed (FIG. 2E).

In the semiconductor circuit fabricated in this manner, the TFTs in the peripheral driving circuit area (two TFTs on the left side of the drawings) has a high field mobility to allow the passage of a large ON current. In addition, the TFT (one on the right side of the drawing) cannot perform a high speed operation. However, it has a low OFF current characteristics, and can have an extremely excellent structure for holding the electric charge of the pixel.

In accordance with the present invention, a crystalline silicon TFT that can be operated at a high speed and an amorphous silicon TFT having a low OFF current characteristics can be formed on the same substrate. When the present invention is applied to a liquid crystal display, an attempt is made to improve the characteristics of mass production and the characteristics.

What is claimed is:

1. An active matrix display device comprising:
   a pixel portion formed over a substrate;
   a peripheral circuit portion over said substrate;
   at least a first thin film transistor formed in the pixel portion;
   at least a second thin film transistor for driving the first thin film transistor formed in the peripheral circuit portion;
   a first active region comprising an amorphous silicon film in the first thin film transistor;
   a second active region comprising a crystalline silicon film in the second thin film transistor,
   wherein said crystalline silicon film includes point defects to be neutralized,
   wherein said crystalline silicon film includes hydrogen or a halogen element at a concentration in a range not higher than $1\times10^{20}$ cm$^{-3}$.

2. A device according to claim 1, wherein said crystalline silicon film has a monodomain structure.

3. A device according to claim 1, wherein said crystalline silicon film has a substantially single crystal structure.

4. A device according to claim 1, wherein said peripheral circuit comprises at least one selected from the group consisting of a column decoder circuit and a line decoder circuit.

5. A device according to claim 1, wherein the active matrix display device is a liquid crystal display device.

6. A device according to claim 1, wherein the crystalline silicon film includes hydrogen or a halogen element at a concentration in a range not lower than $1\times10^{16}$ cm$^{-3}$.

7. An active matrix display device comprising:
   a pixel portion formed over a substrate;
   a peripheral circuit portion over said substrate;
   at least a first thin film transistor formed in the pixel portion;
   at least a second thin film transistor for driving the first thin film transistor formed in the peripheral circuit portion;
   a first active region comprising an amorphous silicon film in the first thin film transistor;
   a second active region comprising a crystalline silicon film in the second thin film transistor,
   wherein said crystalline silicon film includes hydrogen or a halogen element at a concentration in a range of $1\times10^{16}$ to $1\times10^{20}$ cm$^{-3}$.

8. A device according to claim 7, wherein said crystalline silicon film has a monodomain structure.

9. A device according to claim 7, wherein said crystalline silicon film has a substantially single crystal structure.

10. A device according to claim 7, wherein said peripheral circuit comprises at least one selected from the group consisting of a column decoder circuit and a line decoder circuit.

11. A device according to claim 7, wherein the concentration of hydrogen or the halogen element is measured through SIMS.

12. A device according to claim 7, wherein the active matrix display device is a liquid crystal display device.

13. An active matrix display device comprising:
   a pixel portion formed over a substrate;
   a peripheral circuit portion over said substrate;
   at least a first thin film transistor formed in the pixel portion, said first thin film transistor including,
      a first active region comprising an amorphous silicon film and having a first source region, a first drain region, and a first channel region between the first source and drain regions,
      a first gate electrode being adjacent to at least the first channel region with a first gate insulating film therebetween,
   at least a second thin film transistor for driving the first thin film transistor formed in the peripheral circuit portion, said second thin film transistor including,
      a second active region comprising a crystalline silicon film and having a second source region, a second drain region and a second channel region between the second source and drain regions, a second gate electrode being adjacent to at least the second channel region with a second gate insulating film therebetween, an interlayer insulating film covering the first and second thin film transistors;

a pixel electrode being formed on the interlayer insulating film and being electrically connected to one of the first source and drain regions;

an electrode being formed on the interlayer insulating film and being electrically connected to the other of the first source and drain regions, wherein said crystalline silicon film includes point defects to be neutralized, wherein said crystalline silicon film includes hydrogen or a halogen element at a concentration in a range not higher than $1 \times 10^{20}$ cm$^{-3}$.

14. A device according to claim 13, wherein said crystalline silicon film has a monodomain structure.

15. A device according to claim 13, wherein said crystalline silicon film has a substantially single crystal structure.

16. A device according to claim 13, wherein said peripheral circuit comprises at least one selected from the group consisting of a column decoder circuit and a line decoder circuit.

17. A device according to claim 13, wherein the active matrix display device is a liquid crystal display device.

18. A device according to claim 13, wherein the interlayer insulating film comprises silicon oxide.

19. A device according to claim 13, wherein the pixel electrode is electrically connected to one of the first source and drain regions through another electrode being formed on the interlayer insulating film.

20. A device according to claim 13, wherein the crystalline silicon film includes hydrogen or a halogen element at a concentration in a range not lower than $1 \times 10^{16}$ cm$^{-3}$.

21. An active matrix display device comprising:

a pixel portion formed over a substrate;

a peripheral circuit portion over said substrate;

at least a first thin film transistor formed in the pixel portion, said first thin film transistor including,
    a first active region comprising an amorphous silicon film and having a first source region, a first drain region, and a first channel region between the first source and drain regions,
    a first gate electrode being adjacent to at least the first channel region with a first gate insulating film therebetween, at least a second thin film transistor for driving the first thin film transistor formed in the peripheral circuit portion, said second thin film transistor including,
    a second active region comprising a crystalline silicon film and having a second source region, a second drain region and a second channel region between the second source and drain regions,
    a second gate electrode being adjacent to at least the second channel region with a second gate insulating film therebetween, an interlayer insulating film covering the first and second thin film transistors;

a pixel electrode being formed on the interlayer insulating film and being electrically connected to one of the first source and drain regions;

an electrode being formed on the interlayer insulating film and being electrically connected to the other of the first source and drain regions, wherein said crystalline silicon film includes hydrogen or a halogen element at a concentration in a range of $1 \times 10^{16}$ to $1 \times 10^{20}$ cm$^{-3}$.

22. A device according to claim 21, wherein said crystalline silicon film has a monodomain structure.

23. A device according to claim 21, wherein said crystalline silicon film has a substantially single crystal structure.

24. A device according to claim 21, wherein said peripheral circuit comprises at least one selected from the group consisting of a column decoder circuit and a line decoder circuit.

25. A device according to claim 21, wherein the active matrix display device is a liquid crystal display device.

26. A device according to claim 21, wherein the interlayer insulating film comprises silicon oxide.

27. A device according to claim 21, wherein the pixel electrode is electrically connected to one of the first source and drain regions through another electrode being formed on the interlayer insulating film.

28. An active matrix display device comprising:

a pixel portion formed over a substrate;

a peripheral circuit portion over said substrate;

at least a first thin film transistor formed in the pixel portion, said first thin film transistor including,
    a first active region comprising an amorphous silicon film and having a first source region, a first drain region, and a first channel region between the first source and drain regions,
    a first gate electrode being formed over at least the first channel region with a first gate insulating film therebetween, at least a second thin film transistor for driving the first thin film transistor formed in the peripheral circuit portion, said second thin film transistor including,
    a second active region comprising a crystalline silicon film and having a second source region, a second drain region and a second channel region between the second source and drain regions,
    a second gate electrode being formed over at least the second channel region with a second gate insulating film therebetween, an interlayer insulating film covering the first and second thin film transistors;

a pixel electrode being formed on the interlayer insulating film and being electrically connected to one of the first source and drain regions;

an electrode being formed on the interlayer insulating film and being electrically connected to the other of the first source and drain regions, wherein said crystalline silicon film includes point defects to be neutralized, wherein said crystalline silicon film includes hydrogen or a halogen element at a concentration in a range not higher than $1 \times 10^{20}$ cm$^{-3}$.

29. A device according to claim 28, wherein said crystalline silicon film has a monodomain structure.

30. A device according to claim 28, wherein said crystalline silicon film has a substantially single crystal structure.

31. A device according to claim 28, wherein said peripheral circuit comprises at least one selected from the group consisting of a column decoder circuit and a line decoder circuit.

32. A device according to claim 28, wherein the active matrix display device is a liquid crystal display device.

33. A device according to claim 28, wherein the interlayer insulating film comprises silicon oxide.

34. A device according to claim 28, wherein the pixel electrode is electrically connected to one of the first source and drain regions through another electrode being formed on the interlayer insulating film.

35. A device according to claim 28, wherein the crystalline silicon film includes hydrogen or a halogen element at a concentration in a range not lower than $1\times10^{16}$ cm$^{-3}$.

36. An active matrix display device comprising:
a pixel portion formed over a substrate;
a peripheral circuit portion over said substrate;
at least a first thin film transistor formed in the pixel portion, said first thin film transistor including,
a first active region comprising an amorphous silicon film and having a first source region, a first drain region, and a first channel region between the first source and drain regions,
a first gate electrode being formed over at least the first channel region with a first gate insulating film therebetween,
at least a second thin film transistor for driving the first thin film transistor formed in the peripheral circuit portion, said second thin film transistor including,
a second active region comprising a crystalline silicon film and having a second source region, a second drain region and a second channel region between the second source and drain regions,
a second gate electrode being formed over at least the second channel region with a second gate insulating film therebetween,
an interlayer insulating film covering the first and second thin film transistors;
a pixel electrode being formed on the interlayer insulating film and being electrically connected to one of the first source and drain regions;
an electrode being formed on the interlayer insulating film and being electrically connected to the other of the first source and drain regions,
wherein said crystalline silicon film includes hydrogen or a halogen element at a concentration in a range of $1\times10^{16}$ to $1\times10^{20}$ cm$^{-3}$.

37. A device according to claim 36, wherein said crystalline silicon film has a monodomain structure.

38. A device according to claim 36, wherein said crystalline silicon film has a substantially single crystal structure.

39. A device according to claim 36, wherein said peripheral circuit comprises at least one selected from the group consisting of a column decoder circuit and a line decoder circuit.

40. A device according to claim 36, wherein the active matrix display device is a liquid crystal display device.

41. A device according to claim 36, wherein the interlayer insulating film comprises silicon oxide.

42. A device according to claim 36, wherein the pixel electrode is electrically connected to one of the first source and drain regions through another electrode being formed on the interlayer insulating film.

43. An active matrix display device comprising:
a pixel portion formed over a substrate;
a peripheral circuit portion over said substrate;
a switching element including at least a first thin film transistor formed in the pixel portion, said first thin film transistor including,
a first active region comprising an amorphous silicon film and having a first source region, a first drain region, and a first channel region between the first source and drain regions,
a first gate electrode being adjacent to at least the first channel region with a first gate insulating film therebetween,
at least a second thin film transistor for driving the first thin film transistor formed in the peripheral circuit portion, said second thin film transistor including,
a second active region comprising a crystalline silicon film and having a second source region, a second drain region and a second channel region between the second source and drain regions,
a second gate electrode being adjacent to at least the second channel region with a second gate insulating film therebetween,
an interlayer insulating film covering the switching element and the second thin film transistor;
a pixel electrode being formed on the interlayer insulating film and being electrically connected to the switching element;
an electrode being formed on the interlayer insulating film and being electrically connected to one of the first source and drain regions,
wherein said crystalline silicon film includes point defects to be neutralized,
wherein said crystalline silicon film includes hydrogen or a halogen element at a concentration in a range not higher than $1\times10^{20}$ cm$^{-3}$.

44. A device according to claim 43, wherein said crystalline silicon film has a monodomain structure.

45. A device according to claim 43, wherein said crystalline silicon film has a substantially single crystal structure.

46. A device according to claim 43, wherein said peripheral circuit comprises at least one selected from the group consisting of a column decoder circuit and a line decoder circuit.

47. A device according to claim 43, wherein the active matrix display device is a liquid crystal display device.

48. A device according to claim 43, wherein the interlayer insulating film comprises silicon oxide.

49. A device according to claim 43, wherein the crystalline silicon film includes hydrogen or a halogen element at a concentration in a range not lower than $1\times10^{16}$ cm$^{-3}$.

50. An active matrix display device comprising:
a pixel portion formed over a substrate;
a peripheral circuit portion over said substrate;
a switching element including at least a first thin film transistor formed in the pixel portion, said first thin film transistor including,
a first active region comprising an amorphous silicon film and having a first source region, a first drain region, and a first channel region between the first source and drain regions,
a first gate electrode being adjacent to at least the first channel region with a first gate insulating film therebetween,
at least a second thin film transistor for driving the first thin film transistor formed in the peripheral circuit portion, said second thin film transistor including,
a second active region comprising a crystalline silicon film and having a second source region, a second drain region and a second channel region between the second source and drain regions,
a second gate electrode being adjacent to at least the second channel region with a second gate insulating film therebetween,
an interlayer insulating film covering the switching element and the second thin film transistor;

a pixel electrode being formed on the interlayer insulating film and being electrically connected to the switching element;

an electrode being formed on the interlayer insulating film and being electrically connected to one of the first source and drain regions, wherein said crystalline silicon film includes hydrogen or a halogen element at a concentration in a range of $1\times10^{16}$ to $1\times10^{20}$ cm$^{-3}$.

51. A device according to claim 50, wherein said crystalline silicon film has a monodomain structure.

52. A device according to claim 50, wherein said crystalline silicon film has a substantially single crystal structure.

53. A device according to claim 50, wherein said peripheral circuit comprises at least one selected from the group consisting of a column decoder circuit and a line decoder circuit.

54. A device according to claim 50, wherein the active matrix display device is a liquid crystal display device.

55. A device according to claim 50, wherein interlayer the insulating film comprises silicon oxide.

* * * * *